United States Patent
Xu

(10) Patent No.: US 8,373,064 B2
(45) Date of Patent: Feb. 12, 2013

(54) NANO POLYCRYSTALLINE BIO THIN FILM PHOTOVOLTAIC CELL AND PREPARATION METHOD THEREOF

(76) Inventor: Ruisong Xu, Guangdong (CN)

(*) Notice: Subject to any disclaimer, the term of this patent is extended or adjusted under 35 U.S.C. 154(b) by 104 days.

(21) Appl. No.: 12/666,292

(22) PCT Filed: Oct. 16, 2008

(86) PCT No.: PCT/CN2008/072708
§ 371 (c)(1),
(2), (4) Date: Dec. 23, 2009

(87) PCT Pub. No.: WO2010/043082
PCT Pub. Date: Apr. 22, 2010

(65) Prior Publication Data
US 2011/0209757 A1     Sep. 1, 2011

(51) Int. Cl.
*H01L 31/00* (2006.01)
(52) U.S. Cl. .................... 136/263; 136/252
(58) Field of Classification Search ............. 136/263
See application file for complete search history.

(56) References Cited

U.S. PATENT DOCUMENTS

| | | | |
|---|---|---|---|
| 4,927,721 A | 5/1990 | Gratzel et al. | |
| 2005/0072462 A1 | 4/2005 | Kang et al. | |
| 2008/0110496 A1 | 5/2008 | Jung et al. | |

FOREIGN PATENT DOCUMENTS

CN     1175499     11/2004

OTHER PUBLICATIONS

Xu Ruisong, CN 1175499—machine translation, Nov. 10, 2004, 1-10.*
PCT Search Report, Jul. 23, 2009.
ScienceDirect, "The synergistic effect of two photosynthetic pigments in dye-sensitized mesoporous TiO2 solar cells", p. 327-331 by Liu et al., Oct. 30, 2006.
ChemComm, "Dye-sensitized nanocrystalline solar cells based on composite polymer electrolytes containing fumed silica nanoparticles", p. 1661-1663, by Kim et al., Jun. 11, 2004.

* cited by examiner

*Primary Examiner* — Miriam Berdichevsky
(74) *Attorney, Agent, or Firm* — Chun-Ming Shih; HDLS IPR Services

(57) ABSTRACT

This invention relates to a photovoltaic cell and its preparation method. The nano polycrystalline bio thin film photovoltaic cell as provided by the present invention is of layered structure, and the structure from top to bottom is: a top plate insulated and sealed layer, a conductive layer, a nano semiconductor layer, chromophoric molecular layer, an electrolyte polymer layer, a conductive catalyst layer, a conductive layer, a bottom plate insulated and sealed layer. The nano semiconductor layer is made of three metal oxide or metal sulfide, and the electrolyte polymer layer is made of $CeCl_3$, gas $SiO_2$ and LiI. The present invention also provides the preparation method of the nano polycrystalline bio thin film photovoltaic cell. The nano polycrystalline bio thin film photovoltaic cell mentioned in the present invention has higher photovoltaic conversion efficiency, lower cost, and can be applied in construction, family, community, factories and mines and electric net power supply.

14 Claims, 2 Drawing Sheets

US 8,373,064 B2

NANO POLYCRYSTALLINE BIO THIN FILM PHOTOVOLTAIC CELL AND PREPARATION METHOD THEREOF

TECHNICAL FIELD

The present invention relates to a photochemical cell and its preparation method, and more particularly relates to a nano polycrystalline bio thin film photovoltaic cell and its preparation method.

BACKGROUND ART

Due to continuous growth in the global electricity demand and the limited resource in coal, petroleum and natural gas, as well as the release of green house effect gas $CO_2$ during their combustion, in recent years, the generation of electric energy from optical energy has become a more and more meaningful topic.

Photovoltaic cell is a device that converts directly light into electric energy. In addition to possessing two electrodes, it further includes at least one light absorption layer and an electric charge transfer layer.

Photochemical cell made of pure metallic oxide has very low photovoltaic conversion efficiency of about 0.23% under light illumination, because under sunshine, there is a very large gap (3 eV=400 mm) between valence band and conduction band. In addition, metal oxide or metal sulfide semiconductors has limited the absorption of violet and ultraviolet light. Although metal oxide or metal sulfide semiconductors are very good electric conductor, when electrolyte is illuminated under light, stable photochemical reaction will be generated and resistance will be generated in turn.

Photo-sensitive agent in photochemistry can generate photovoltaic effect under sunshine, and the photovoltaic effect can be reinforced under chemical superposition or the synergism of pigment. Photo-sensitive agent, dye or pigment can realize electronic transfer, that is, valence change, on semiconductor surface. Photovoltaic device has two functions of optical absorption and valence change. In optical absorption, electrons are carried out through pigment on surface layer, and valence electronic transfer is realized on the contact surface between semiconductor and pigment. The photovoltaic chemical system on nano metal oxide semiconductor surface has a smoother layer, which can absorb photovoltaic energy to its largest extent.

In recent years, photochemical cell develops rapidly, but in most of the cases, the art involved is very complicated, and only visible light or weak light can be absorbed, in addition, photovoltaic conversion efficiency is low, cost is high, pollution is serious, thus, mass production becomes very difficult.

SUMMARY OF THE INVENTION

Therefore, the present invention aims to solve the current issues in photovoltaic cell, for example, high preparation cost, narrow work wavelength range and low photovoltaic conversion efficiency, provides a wide wavelength range nano polycrystalline bio thin film photochemical cell with low cost and high photovoltaic conversion efficiency.

Figure 1:
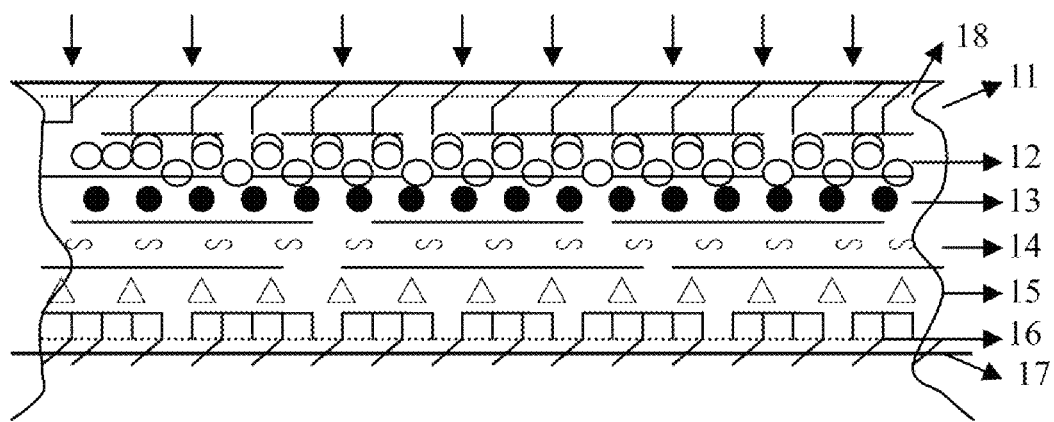

The present invention provides a nano polycrystalline bio thin film photovoltaic cell, which is a layered structure as shown in FIG. 1. The structure from top to bottom is: a top plate insulated and sealed layer; a conductive layer; a nano metal oxide semiconductor layer; a chromophoric molecular layer; an organic polymer electrolyte layer; a conductive catalyst layer; a conductive layer; a bottom plate insulated and sealed layer. The nano semiconductor layer is made of a mixture of at least two components of metal oxide or metal sulfide.

The nano semiconductor layer is made of mixture of three oxides or sulfides of Ti, Zn, Nb, In, Sn, V, Cr, Mo, Fe, W, Al, that is, it could be made of a mixture of three metal oxides or three metal sulfides, or a mixture of metal oxide and metal sulfide.

Metal oxide or metal sulfide semiconductor material that can be selected as the nano semiconductor layer is metal oxide or metal sulfide with valence 2, 3, 4, 5, 6 and semiconductor property, for example, $TiO_2$, $ZnO$, $Nb_2O_5$, $SnO_2$, $Fe_2O_3$, $Al_2O_3$, $GeS$, etc. Metal oxide or metal sulfide with semiconductor property or oxide with large (dismutation) energy band in compound valence band and metallic conduction band can be selected. Furthermore, compound with excellent characteristic and low cost and being environmentally friendly will be preferred.

The above mentioned nano semiconductor layer has roughness of 100-220 and film thickness of 10-25 μm.

The conductive layer and the top, bottom plate insulated and sealed layer should have light transmission of larger than 83% so that light can reach chromophoric molecular layer to realize photovoltaic conversion. The top plate insulated and sealed layer must be made of transparent and insulated material such as glass or plastic. The conductive layer can be transparent conductive glass or conductive plastic, metal Al and Pt, etc. The two conductive layers are used to collect free electron, that is, forming collecting electrode so as to provide electric charge to the external circuit.

As for the conductive catalyst layer, it is composed of Pt and C in weight ratio of 99:1 or Au and C in the weight ratio of 99:1.

On the chromophoric molecular layer of nano polycrystalline bio thin film photovoltaic cell of the present invention is a electrolyte polymer layer, which can be made of rare-earth catalyst $CeCl_3$, gas $SiO_2$ and LiI. Electrons act on electrolyte layer. The chromophoric molecular layer has roughness of 100-220, the rough surface is then the effective and active interface of photovoltaic chemistry on the surface of nano metal oxide or metal sulfide semiconductor surface.

Rough polycrystalline structural surface area is generally larger than the mono-molecule surface area of pigment. Therefore, when light is incident on the surface of nano polycrystalline semiconductor, it will then be converted into large electric power. But the doped nano polycrystalline semiconductor layer can transmit part of the light, that is, part of the light will be incident on photovoltaic interface, and part of the light will be reflected. When light transmits through doped nano metal semiconductor layer, it will be directly or indirectly absorbed by chromophoric molecular layer and get converted into electric power. When all the lights are incident to the interface, huge electric power will be obtained.

Different chromophore has different spectral response ability. The selection of chromophore with excellent performance is to use the lowest cost to acquire better photovoltaic conversion efficiency and non-contaminated production.

Figure 2:
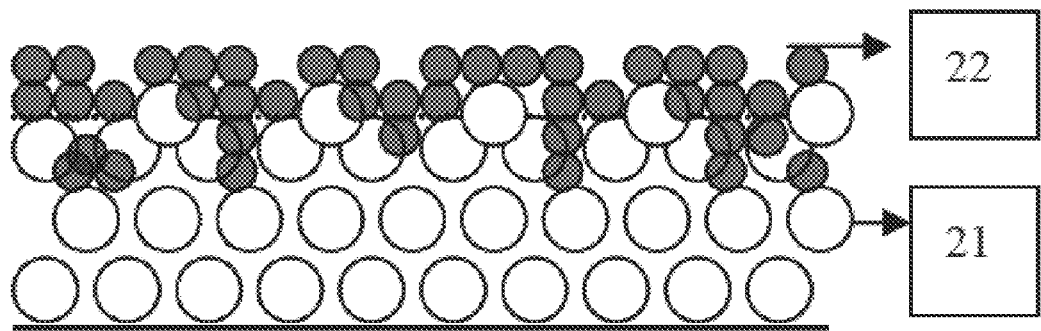

Chromophore can be adsorbed onto the surface of nano semiconductor layer through chemical adsorption method, as shown in FIG. 2. Generally, natural bio pigment of vegetable and algae or synthetic chromophore is selected, for example, the compound of metal elements such as Ru, Os, Au, etc., such as the compound of trivalent Ru and diazine and tetravalent dihydroxy, trivalent oxide and phthalocyanine, etc., in addition, good performance, low cost and environment-friendly should be considered.

The electrolyte of nano polycrystalline bio thin film photovoltaic cell of the present invention is the LiI electrolytic solution of gas phase silicon dioxide organic polymer or other redox agent. Due to its high redox potential, it replaces the electric charge transfer of substance. Meanwhile, 0.1% $CeCl_3$ is added as catalyst so as to enhance redox reaction rate, in the mean time, solidified by gas phase $SiO_2$, therefore it is difficult to get leaked, and the stability of photovoltaic cell is enhanced.

The present invention also provides a preparation method for preparing the above mentioned nano polycrystalline bio thin film photochemical cell, including the followings steps:

Heating first metal oxide to 200° C., keeping it at isothermal condition for 12 hours, then heating it up to 235° C., keeping it at isothermal condition for 10 hours to form first metal oxide emulsifying solution of particle diameter 20 nm;

Cooling the emulsifying solution obtained from step (1) and adding a second metal oxide with weight of 1.5-2% of the emulsifying solution, a third metal oxide with weight of 1-1.5% of the emulsifying solution, isopropyl alcohol (IPA) with weight of 1-2% of the emulsifying solution and enough amount of DI water, then heating it up to 80° C., agitating and evaporating to form doped nano emulsifying mixed solution; wherein, the total weight of IPA and the three metal oxides occupies 40-45% of nano emulsifying mixed solution, then cooling it for future use;

Printing, on the conductive layer on the top plate insulated and sealed layer, with the doped nano emulsifying solution obtained from step (2) to form a nano metal oxide semiconductor film;

Heating that obtained from step (3) to 450-470° C., and keeping it at isothermal condition for one hour, then cooling it naturally and taking it out;

Heating China tea in purified water up to 100° C., keeping it isothermally for half an hour, then evaporating it to pigment concentration of 10-4 mol/l and adjusting the PH value to 3.5;

Then putting that obtained from step (4) into the solution obtained from step (5) and keeping it at isothermal condition for 60° C., immersing for 1 hour, thereby chromophoric molecular layer will be self-assembly formed;

Putting that obtained from step (6) into LiI liquid electrolyte and adding $CeCl_3$ of weight of 0.1% and gas phase $SiO_2$ of weight of 1.5% to form electrolyte polymer layer;

Spraying and sintering Pt or Au with quality percentage of 99% and C with quality percentage of 1% on the conductive layer of the bottom plate insulated and sealed layer to form conductive catalyst layer;

Then packaging the above layers to form nano polycrystalline bio thin film photovoltaic cell.

The metal oxide as described in the preparation method of nano polycrystalline bio thin film photochemical cell of the present invention can be replaced by metal sulfide.

The IPA mentioned in step (2) can be replaced by ethanol, methanol or cyclohexane to achieve the same effect.

The present invention has improved the preparation arts of nano polycrystalline metal oxide semiconductor chemical photovoltaic cell, in that, it mainly uses Sol-Gel arts and nano self-assembly arts, and the preparation environmental humidity is generally smaller than 45-48%. Under an environment with humidity of 45%, the doped nano metal oxide or metal sulfide semiconductor layer will, under monochromatic condition, have 10-15% photovoltaic conversion efficiency.

The advantages of the invention include:

1. Since in the preparation arts, biomimetics, computer analogy and nano self-assembly arts are used, the operation is easy, with low cost and without pollution.

2. The photovoltaic conversion efficiency is 10-15%, as compared to similar other products, the photovoltaic conversion efficiency is higher by 1-3%. The theoretical value of photovoltaic conversion efficiency is larger than 95%, leaving a large room to be enhanced further. Meanwhile, it can work in the full wavelength under weak light, with stable performance and a life span of more than 20 years. Its production cost is lower than one US dollar, which is only ¼ of single crystal silicon. However, for single crystal silicon photovoltaic cell, the theoretical limit value of conversion efficiency is 35%, which can only work under sunshine.

3. It can be used as construction material, soundproofing wall, etc., that is to say, this material could be used for several purposes.

BRIEF DESCRIPTIONS OF THE DRAWINGS

FIG. 1 is the sectional view of the nano polycrystalline bio thin film photovoltaic cell as described in the present invention.

11 denotes the conductive layer, which can be transparent conductive glass or conductive plastic;

12 denotes the nano semiconductor layer;

13 denotes the chromophoric molecular layer;

14 denotes the electrolyte polymer layer;

15 denotes the conductive catalyst layer;

16 denotes the conductive layer;

17 denotes the bottom plate insulated and sealed layer 18 denotes the top plate insulated and sealed layer.

FIG. 2 is an illustration of the plane constructed by nano semiconductor layer and chromophoric molecular layer.

21 denotes the nano semiconductor layer, with a rough surface of roughness 180-220;

22 denotes the chromophoric molecular layer absorbed on nano semiconductor layer.

Figure 3:
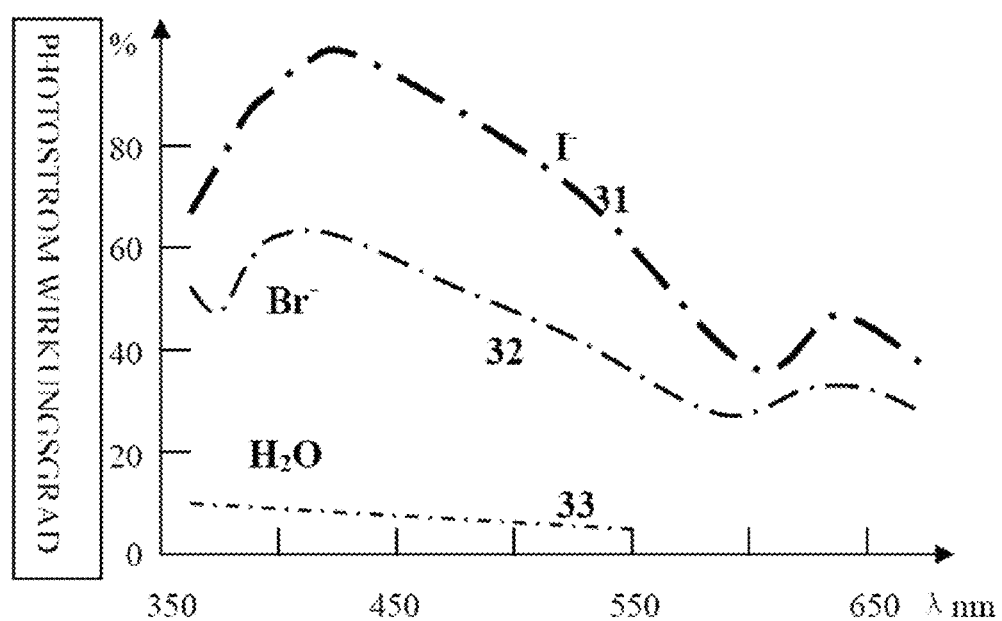

FIG. 3 is the photovoltaic conversion efficiency curve of nano polycrystalline bio thin film photovoltaic cell described in the present invention, which reflects different photovoltaic conversion efficiency generated by different incidence and different electrolyte.

Figure 4:
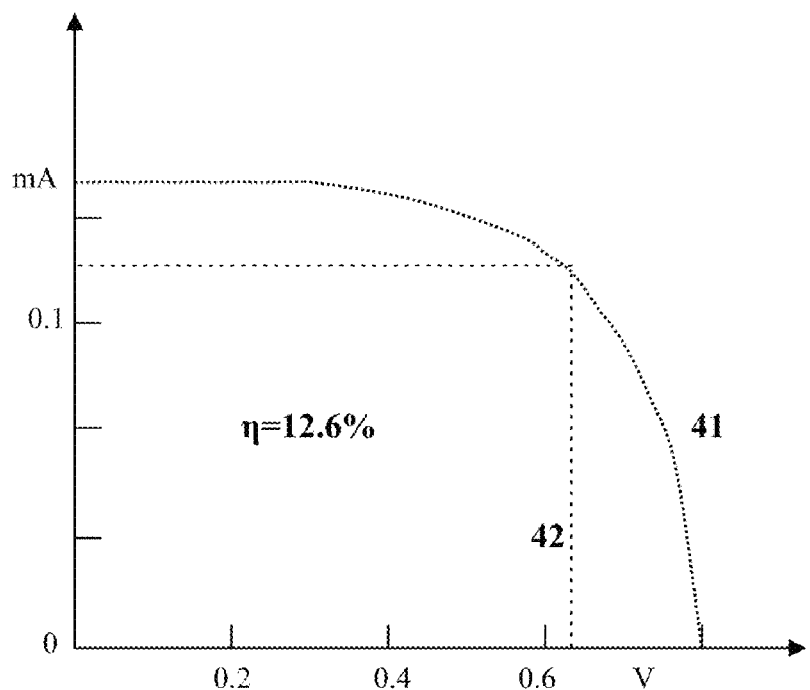

Y axis is photovoltaic conversion efficiency, x axis is the wavelength (nm) of the incident light;

31 denotes the photovoltaic characteristic curve of nano polycrystalline bio thin film photovoltaic cell which is injected with 1M LiI electrolyte on the interface of doped $TiO_2$ and pigment;

32 denotes the photovoltaic characteristic curve of nano polycrystalline bio thin film photovoltaic cell which is injected with 0.5MLiBr electrolyte on the interface of doped $TiO_2$ and pigment;

33 denotes the photovoltaic characteristic curve of nano polycrystalline bio thin film photovoltaic cell which is injected with water electrolyte on the interface of doped $TiO_2$ and pigment;

FIG. 4 is the I-V characteristic curve of nano polycrystalline bio thin film photovoltaic cell as mentioned in embodiment 1 of the present invention under the incident light of 450 nm;

41 denotes the I-V characteristic curve of nano polycrystalline bio thin film photovoltaic cell (1 $cm^2$) mentioned in embodiment 1;

42 denotes the space factor of nano polycrystalline bio thin film photovoltaic cell mentioned in embodiment 1 of the present invention.

DETAILED DESCRIPTION OF THE EMBODIMENTS

Embodiment 1

A nano polycrystalline bio thin film photovoltaic cell, which can be prepared as following:

Heating $TiO_2$ to 200° C., keeping it isothermally for 12 hours, then heating it up to 235° C., then keeping it isothermally for 10 hours, then a nano $TiO_2$ emulsifying solution with particle diameter of 20 nm is formed. The operation temperature is 26° C., humidity is 45%.

Cooling the nano $TiO_2$ emulsifying solution as obtained from step (1) and add ZnO with weight percentage of 2% of the nano $TiO_2$ emulsifying solution, $Fe_2O_3$ with weight percentage of 1.5% of the nano $TiO_2$ emulsifying solution, IPA with weight percentage of 2% of the nano $TiO_2$ emulsifying solution and enough amount of DI water, then heating it up to 80° C. and agitating and evaporating it to form doped nano emulsifying mixed solution, wherein, the total weight of ZnO, $Fe_2O_3$, IPA and nano $TiO_2$ emulsifying solution occupies a percentage of 45%, then cooling it for future use;

Using screen with pore diameter of 40 μm to print the doped nano emulsifying solution prepared in step (2) on the conductive surface of $SnO_2$ conductive glass made on the top plate insulated and sealed layer to form a nano semiconductor layer;

Heating that obtained from step (3) up to 470° C., then keeping it isothermally for 1 hour, then cooling it naturally and taking it out;

Heating China tea in purified water up to 100° C., then keeping it isothermally for half an hour, then evaporating it up to pigment (Including chlorophyll a, chlorophyll b, xanthophyll, carotenoid, etc.) concentration of $10^{-4}$ mol/l, and adjusting the PH value to 3.5.

Putting that obtained from step (4) into the solution obtained from step (5), then heating it up to 60° C., keeping it immersed in isothermal condition for one hour to self-assembly form a chromophoric molecular layer;

Adding $CeCl_3$ that occupies 0.1% of the LiI weight and gas phase $SiO_2$ that occupies 1.5% of the LiI weight to the LiI liquid electrolyte to form a electrolyte polymer layer;

Spraying and sintering Pt or Au with quality percentage 99% and C with quality percentage of 1% on the conductive layer of bottom plate insulated and sealed layer to form a conductive catalyst layer;

Packaging all the layers above to form a nano polycrystalline bio thin film photovoltaic cell.

The prepared nano polycrystalline bio thin film photovoltaic cell has a nano semiconductor layer with film thickness of 10 μm and surface roughness of 200.

The photovoltaic conversion efficiency curve of the nano polycrystalline bio thin film photovoltaic cell mentioned in the present invention is shown in FIG. 4. Using doped nano $TiO_2$ semiconductor to form positive electrode, and using Pt layer to form negative electrode. Y axis is current (I, mA), x axis is voltage (V). The measured photovoltaic cell area is 1 $cm^2$, and the incident light intensity to photovoltaic cell is 1.55 w/m². The received light intensity of photovoltaic cell is 0.33 mw. The composition of electrolyte is $10^{-4}M$ $HClO_4$, 1M LiI, and $10^{-4}$I, and the specific detection wavelength is 450 nm.

As shown in FIG. 4, the monochromatic photovoltaic conversion efficiency of the prepared nano polycrystalline bio thin film photovoltaic cell is 12.6%. Photovoltaic conversion efficiency is defined as photovoltaic output power 100%/incident light energy; the space factor (that is, the rectangle formed by two dotted lines) is 0.7, and space factor is defined as the maximum output power/closed circuit current·open circuit voltage.

Embodiment 2

A nano polycrystalline bio thin film photovoltaic cell with the following method of preparation is described, the method includes:

Heating $Nb_2O_5$ up to 200° C., then keeping it isothermally for 12 hours, then heating it up again to 235° C., then keeping it isothermally for 10 hours. Then the nano $Nb_2O_5$ emulsifying solution with particle diameter of 20 nm is formed; the operation temperature is 24° C., humidity is 46%.

Cooling the nano $Nb_2O_5$ emulsifying solution as obtained from step (1), then adding $MoO_3$ with weight of 1.5% of the nano $Nb_2O_5$ emulsifying solution, $Al_2O_3$ with weight of 1% of the nano $Nb_2O_5$ emulsifying solution, ethanol with weight of 1% of the nano $Nb_2O_5$ emulsifying solution and enough amount of DI water. Then heating it up to 80° C. and agitating and evaporating to form doped nano emulsifying mixing solution, wherein the total weight of the $MoO_3$, the $Al_2O_3$, the ethanol and the nano $Nb_2O_5$ emulsifying solution occupies 40%. Then cooling it for future use;

Printing the doped nano emulsifying mixing solution prepared in step (2) on the conductive layer made on top plate insulated and sealed layer to form a nano semiconductor layer;

Heating that obtained from step (3) up to 450° C., then keeping it isothermally for one hour, cooling it naturally and taking it out;

Heating China tea in purified water up to 100° C., then keeping it isothermally for half an hour, then evaporating it up to pigment (Including chlorophyll a, chlorophyll b, xanthophyll, carotenoid, etc.) concentration of $10^{-4}$ mol/l, and adjusting the PH value to 3.5.

Putting that obtained from step (4) into the solution obtained from step (5), then heating it up to 60° C., keeping it immersed in isothermal condition for one hour to self-assembly form a chromophoric molecular layer;

Adding $CeCl_3$ that occupies 0.1% of LiI weight and gas phase $SiO_2$ that occupies 1.5% of LiI weight to the LiI liquid electrolyte to form an electrolyte polymer layer;

Spraying and sintering Pt or Au with quality percentage of 99% and C with quality percentage of 1% on the conductive layer of bottom plate insulated and sealed layer to form a conductive catalyst layer;

Packaging all the layers above to form nano a polycrystalline bio thin film photovoltaic cell.

The space factor of the prepared nano polycrystalline bio thin film photovoltaic cell is 0.8, the film thickness of the doped $Nb_2O_5$ nano semiconductor film is 25 μm, and the surface roughness of the semiconductor thin film is 150. The monochromatic photovoltaic conversion efficiency of the prepared nano polycrystalline bio thin film photovoltaic cell is 15%.

Embodiment 3

A nano polycrystalline bio thin film photovoltaic cell with preparation method is described, the method includes:

Heating InS up to 200° C., keeping it isothermally for 12 hours, then heating it up again to 235° C., and keeping it isothermally for 10 hours. Nano InS emulsifying solution with particle diameter of 20 nm is then formed; the operation temperature is 25° C., humidity is 48%.

Cooling the nano InS emulsifying solution as obtained from step (1) and adding $Al_2O_3$ with weight percentage of 1.8% of the nano InS emulsifying solution, $Fe_2O_3$ with weight percentage of 1.8% of the nano InS emulsifying solution, IPA with weight percentage of 1.5% of the nano InS emulsifying solution and enough amount of DI water. Then heating it up to 80° C. and agitating and evaporating it to form doped nano emulsifying mixed solution, wherein, the total weight of the $Al_2O_3$, the $Fe_2O_3$, the methanol and the nano InS emulsifying solution occupies 43%. Then cooling it for future use;

Printing the doped nano emulsifying solution as prepared in step (2) on the conductive layer as made on top plate insulated and sealed layer to form a nano semiconductor layer;

Heating that obtained from step (3) up to 460° C., then keeping it isothermally for 1 hour, then cooling it naturally and taking it out;

Heating China tea in purified water up to 100° C., then keeping it isothermally for half an hour, then evaporating it up to pigment (Including chlorophyll a, chlorophyll b, xanthophyll, carotenoid, etc.) concentration of $10^{-4}$ mol/l, and adjusting the PH value to 3.5.

Putting that obtained from step (4) into the solution obtained from step (5), then heating it up to 60° C., keep it immersed in isothermal condition for one hour to self-assembly form chromophoric molecular layer;

Adding $CeCl_3$ that occupies 0.1% of LiI weight and gas phase $SiO_2$ that occupies 1.5% of LiI weight to the LiI liquid electrolyte to form an electrolyte polymer layer;

Spraying and sintering Pt or Au with quality percentage of 99% and C with quality percentage of 1% on the conductive layer of bottom plate insulated and sealed layer to form a conductive catalyst layer;

Packaging all the layers above to form nano polycrystalline bio thin film photovoltaic cell.

The space factor of the prepared nano polycrystalline bio thin film photovoltaic cell is 0.75, and the film thickness of the obtained doped InS semiconductor film is 15 μm. The surface roughness of the semiconductor film is 220. The monochromatic photovoltaic conversion efficiency of the prepared nano polycrystalline bio thin film photovoltaic cell is 12%.

COMPARISON EXAMPLE 4

A comparison of nano polycrystalline bio thin film photovoltaic cell as mentioned in the present invention with other photovoltaic cell is described hereafter.

The embodiments mentioned above are only preferable embodiments of the present invention and are not used to limit the protection scope of the present invention.

What is claimed is:

1. A nano polycrystalline bio thin film photovoltaic cell with layer structure in a sequence from top to bottom as the followings:

(1) a top plate insulated and sealed layer;
   (2) a conductive layer;
   (3) a nano semiconductor layer;
   (4) a chromophoric molecular layer;
   (5) an electrolyte polymer layer;
   (6) a conductive catalyst layer;
   (7) a conductive layer of the bottom plate sealed layer;
   (8) a bottom plate insulated and sealed layer;
      wherein said nano semiconductor layer is made of the mixing of first, second and third metallic oxides or metallic sulfides, and said electrolyte polymer layer is made of $CeCl_3$, gas $SiO_2$ and LiI.

2. The nano polycrystalline bio thin film photovoltaic cell according to claim 1, wherein said nano semiconductor layer material is selected from the oxide or sulfide of Ti, Zn, Nb, In, Sn, V, Cr, Mo, Fe, W, Al.

3. The nano polycrystalline bio thin film photovoltaic cell according to claim 1, wherein said electrolyte polymer layer is made of LiI, $CeCl_3$ that occupies 0.1% of the weight of LiI and gas phase SiO2 that occupies 1.5% of the weight of LiI.

4. The nano polycrystalline bio thin film photovoltaic cell according to claim 1, wherein said conductive catalyst layer is made of Pt and C in weight ratio of 99:1 or Au and C in weight ratio of 99:1.

5. The nano polycrystalline bio thin film photovoltaic cell according to claim 1, wherein said top plated insulated and sealed layer, bottom plate insulated and sealed layer and said conductive layer have transmission to light larger than 83%.

6. The nano polycrystalline bio thin film photovoltaic cell according to claim 1, wherein said nano semiconductor layer has roughness of 100-220 and film thickness of 10-25 μm.

TABLE 1

A comparison of the nano polycrystalline bio thin film photovoltaic cell as mentioned in the present invention with other photovoltaic cell.

| Product name | Photovoltaic conversion efficiency % | Work wavelength range | Stability | Work lifetime (year) | Production cost (US dollar/peak watt) |
|---|---|---|---|---|---|
| Single crystal silicon | 22-28 | Visible light | Stable | 25-30 | 3-6 |
| Polycrystalline silicon | 5-18 | Visible light | More stable | 10-20 | 2-5 |
| Amorphous silicon | 3-7 | Weak light | Not stable | 3-5 | 2-4 |
| Band type silicon | 5-11 | Visible light | More stable | 5-15 | 2-4 |
| Silicon film | 5-12 | Visible light | More stable | 5-15 | 1.5-2.5 |
| Focused type | 25-28 | Visible light | Stable | 20-25 | 4-6 |
| CdTe | 23 | Visible light | Stable | 15-20 | 3-5 |
| Amorphous/single crystal silicon | 8-15 | Weak light | More stable | 5-15 | 2-4 |
| Nano polycrystalline bio thin film photovoltaic cell as mentioned in the present | 10-15 | Near UV-near IR | More stable | 20-25 | 0.6-1 |

7. A preparation method of nano polycrystalline bio thin film photovoltaic cell according to claim 1, including the followings steps:
- (1) heating first said of metallic oxide or metallic sulfide to 200° C., then keeping it isothermally for 12 hours, then raising the temperature to 235° C. and keeping it isothermally for 10 hours to form emulsifying solution of the first type of metallic oxide or metallic sulfide with particle diameter of 20 nm;
- (2) cooling said emulsifying solution as obtained in step (1) and adding said second metallic oxide or metallic sulfide with weight of 1.5-2% of said emulsifying solution, said third metallic oxide or metallic sulfide with weight of 1-1.5% of said emulsifying solution, isopropyl alcohol or ethanol or methanol or cyclohexane with weight of 1-2% of the emulsifying solution and enough amount of deionized water, then heating it up to 80° C. and agitating and evaporating it to form doped nano emulsifying mixing solution, wherein the total weight of said isopropyl alcohol or ethanol or methanol or cyclohexane and said first, second and third metallic oxides or sulfides occupies 40-45% of said nano emulsifying mixing solution, then cooling it for future use;
- (3) printing, on said conductive layer on the top plate insulated and sealed layer, with said doped nano emulsifying solution as obtained from step (2) to form said nano semiconductor layer;
- (4) heating that obtained from step (3) to 450-470° C., and keeping it at isothermal condition for one hour, then cooling it naturally and taking it out;
- (5) heating China tea in purified water up to 100° C., keeping it isothermally for half an hour, then evaporating it to pigment concentration of $10^{-4}$ mol/l and adjusting the PH value to 3.5;
- (6) then putting that obtained from step (4) into said solution obtained from step (5) and keeping it at isothermal condition for 60° C., then immersing for 1 hour, then a chromophoric molecular layer will be self-assembly formed;
- (7) putting that obtained from step (6) into LiI liquid electrolyte and adding $CeCl_3$ with weight of 0.1% and gas phase $SiO_2$ with weight of 1.5% to form said electrolyte polymer layer;
- (8) spraying and sintering Pt or Au with quality percentage of 99% and C with quality percentage of 1% on said conductive layer of the bottom plate sealed layer to form said conductive catalyst layer;
- (9) then packaging the layers above to form said nano polycrystalline bio thin film photovoltaic cell.

8. The preparation method of nano polycrystalline bio thin film photovoltaic cell according to claim 7, wherein said first, second and third metallic oxides or metallic sulfides are metallic oxides.

9. The preparation method of nano polycrystalline bio thin film photovoltaic cell according to claim 7, wherein said isopropyl alcohol or ethanol or methanol or cyclohexane is isopropyl alcohol.

10. The preparation method of nano polycrystalline bio thin film photovoltaic cell according to claim 7, wherein an operation temperature of said step (2) is 24° C.-26° C., and the humidity is 45-48%.

11. The preparation method of nano polycrystalline bio thin film photovoltaic cell according to claim 7, wherein said first, second and third metallic oxides or metallic sulfides are metallic sulfides.

12. The preparation method of nano polycrystalline bio thin film photovoltaic cell according to claim 7, wherein said isopropyl alcohol or ethanol or methanol or cyclohexane is ethanol.

13. The preparation method of nano polycrystalline bio thin film photovoltaic cell according to claim 7, wherein said isopropyl alcohol or ethanol or methanol or cyclohexane is methanol.

14. The preparation method of nano polycrystalline bio thin film photovoltaic cell according to claim 7, wherein said isopropyl alcohol or ethanol or methanol or cyclohexane is cyclohexane.

* * * * *